(12) United States Patent
Shibagaki et al.

(10) Patent No.: US 7,385,464 B2
(45) Date of Patent: Jun. 10, 2008

(54) RESONATOR TYPE FILTER

(75) Inventors: Nobuhiko Shibagaki, Kokubunji (JP); Mitsutaka Hikita, Hachioji (JP)

(73) Assignee: Hitachi Media Electronics Co., Ltd., Iwate-ken (JP)

( * ) Notice: Subject to any disclaimer, the term of this patent is extended or adjusted under 35 U.S.C. 154(b) by 348 days.

(21) Appl. No.: 11/312,414

(22) Filed: Dec. 21, 2005

(65) Prior Publication Data

US 2007/0052494 A1 Mar. 8, 2007

(30) Foreign Application Priority Data

Sep. 8, 2005 (JP) ............................. 2005-260092

(51) Int. Cl.
H03H 9/70 (2006.01)
H03H 9/54 (2006.01)
H03H 9/64 (2006.01)

(52) U.S. Cl. ...................... 333/133; 333/189; 333/193; 333/195

(58) Field of Classification Search ................ 333/133, 333/189, 193, 195; 310/313 B, 313 D
See application file for complete search history.

(56) References Cited

U.S. PATENT DOCUMENTS

| 7,271,684 B2 * | 9/2007 | Nishihara et al. ............ 333/133 |
| 2004/0130411 A1 * | 7/2004 | Beaudin et al. ............. 333/133 |
| 2004/0140866 A1 | 7/2004 | Taniguchi |

FOREIGN PATENT DOCUMENTS

| JP | 8-265099 | * 10/1996 |
| JP | 11-195957 | 7/1999 |
| JP | 2000-077972 | * 3/2000 |
| JP | 2001-044790 | 2/2001 |
| JP | 2001-345675 | 12/2001 |
| JP | 2002-217676 | * 8/2002 |
| JP | 2002-223147 | 8/2002 |
| JP | 2003-332884 | * 11/2003 |
| JP | 2003-347896 | 12/2003 |
| JP | 2004-007093 | * 1/2004 |
| JP | 2004-242281 | 8/2004 |

OTHER PUBLICATIONS

R. Ruby et al., "PCS 1900MHz Duplexer Using Thin Film Bulk Acoustic Resonators (FBARs)", Electronics Letters, May 13, 1999, vol. 35, No. 10, pp. 794-795.*

* cited by examiner

*Primary Examiner*—Barbara Summons
(74) *Attorney, Agent, or Firm*—Mattingly, Stanger, Malur & Brundidge, PC

(57) ABSTRACT

A resonator is connected in parallel to at least one serial-arm-connected resonator in a resonator type filter having a serial arm and a parallel arm. At this time, the resonance frequency of the resonator connected in parallel is set to be substantially the same as the resonance frequency of the parallel-arm-connected resonator.

This makes it possible to prevent the deterioration of attenuation levels at the lower-frequency side of the filter, caused by an increase in the resistance of a connection element due to an increase in packaging density.

8 Claims, 11 Drawing Sheets

PSC: Phase Shift Circuit

PACKAGE (LARGE)

PACKAGE (SMALL)

RESONATOR TYPE FILTER

CLAIM OF PRIORITY

The present application claims priority from Japanese application JP 2005-260092 filed on Sep. 8, 2005, the content of which is hereby incorporated by reference into this application.

FIELD OF THE INVENTION

The present invention relates to resonator type filters, and more particularly, to a resonator type filter suitable for use in a filtering device which separates the GHz-band high-frequency output signals or input signals used for communications devices such as hand-held telephones.

BACKGROUND OF THE INVENTION

In recent years, it is becoming absolutely necessary for hand-held phones to have not only mere call-placing/receiving functions, but also a high-speed data communications function. Accordingly, demands for reduction in the areas/volumes of their high-frequency sections that implement communications are coming to be more stringent. Among these high-frequency sections, a filtering section, in particular, that sorts out necessary signals for communications is increasingly required to have more compact, higher-performance characteristics, along with the reduction in the dimensions of other high-frequency sections.

A so-called a resonator type filter that is such a combination of a serial arm resonator and a parallel arm resonator as disclosed in Patent Reference 1 listed below, is most commonly used as a means of realizing the high-performance filter required for mobile communications. In Patent Reference 1, a surface acoustic wave resonator that has roll-up window blind-shaped electrodes on a piezoelectric substrate and excites surface elastic waves is disclosed as a means of realizing a resonator. The resonator used in the resonator type filter disclosed in Patent Reference 1, however, is not limited to application as a surface acoustic wave resonator. For example, non-Patent Reference 1 listed below introduces examples of practical use of the FBAR (Filmed Bulk Acoustic Resonator) formed by depositing a piezoelectric thin film on a lower electrode and further depositing an upper electrode on the piezoelectric thin film to excite longitudinal vibration in the film-thickness direction of the piezoelectric thin film.

In contrast to this, the techniques outlined below are disclosed as publicly known means of improving the characteristics of a resonator type filter by connecting some high-frequency circuit element in parallel to a resonator.

Patent Reference 2 discloses a technique for improving frequency characteristics by connecting a capacitive element in parallel to a serial arm resonator and controlling the intervals between a serial resonance frequency and a parallel resonance frequency.

Patent Reference 3 discloses a technique for connecting a capacitive element in parallel to a serial arm resonator and thus conducting temperature characteristics compensations on this resonator according to the particular temperature characteristics of the capacitive element.

Furthermore, Patent Reference 4 discloses a technique for improving frequency characteristics by connecting an inductive element in parallel to a serial arm resonator and controlling the intervals between a serial resonance frequency and a parallel resonance frequency.

Besides, the techniques described in Patent References 5 and 6 are known as techniques for improving the filtering characteristics of a surface acoustic wave resonator.

The technique described in Patent Reference 5 is intended to improve the deterioration of the attenuation levels at the lower-frequency side by maintaining in a required relationship the resonance frequency and anti-resonance frequency of the composite resonator consisting of a series-connected acoustic wave resonator and a parallel-connected acoustic wave resonator.

The technique described in Patent Reference 6 relates to a filter which, in a parallel-arm acoustic wave resonator with a required resonance frequency and in a serial-arm acoustic wave resonator with an anti-resonance frequency, has an impedance element connected in series to the serial-arm acoustic wave resonator, and an impedance element connected in parallel thereto.

Patent Reference 1:
  Japanese Patent Laid-Open No. Hei 11-195957

Patent Reference 2:
  Japanese Patent Laid-Open No. 2001-345675

Patent Reference 3:
  Japanese Patent Laid-Open No. 2001-44790

Patent Reference 4:
  Japanese Patent Laid-Open No. 2004-242281

Patent Reference 5:
  Japanese Patent Laid-Open No. 2003-347896

Patent Reference 6:
  Japanese Patent Laid-Open No. 2002-223147

Non-Patent Reference 1:
  ELECTRONICS LETTERS, 13th May, Vol. 35, No. 10, pages 794-795

SUMMARY OF THE INVENTION

In both the above-mentioned surface acoustic wave resonator and the FBAR, vibration will attenuate unless a hollow space is reserved at an upper section of a piezoelectric vibrator. Therefore, a filter chip is housed in a package constructed of ceramics or other materials, and necessary electrical connection is implemented via the package. Wire bonding, flip-chip bonding, VIA holes extending through the package, or other means are used, as appropriate, to connect the filter chip and external circuits. For wire bonding, bonding wires as short as possible are used in increased numbers to minimize the electrical resistance of the connection means. Also, VIA holes with the largest possible diameter are used in large numbers.

While the application of resonator type filters as a means of achieving the frequency selection characteristics necessary for mobile communications is increasing, demands for dimensional reduction of these filters are also stringent as mentioned earlier. As the package for housing the filter chip is miniaturized, wire bonding, using the VIA holes in the package, and using other means of connection to external circuits will necessarily make it difficult to ignore the resistance components of the material(s) forming the package. For the resonator filters, in particular, that form an attenuation band at the lower-frequency side of a pass band by utilizing the fact that the impedance of a parallel arm resonator infinitely approaches zero at a serial resonance frequency, an increase in the resistance of the means of connection to the external circuits prominently appears as the deterioration of attenuation levels in the lower-frequency attenuation band.

In many of the worldwide-proliferating hand-held telephone systems based on specifications such as the US PCS specifications or the W-CDMA specifications of third-generation hand-held telephones, receiving-band frequencies are set to a lower-pass side than that of transmitting-band frequencies. In these systems, a receiving filter with a transmitting-band attenuation of approximately 50 dB and a receiving-band pass loss of several dB becomes necessary to separate a signal transmitted from the hand-held terminal, from a very weak signal coming in from a base station or a cell station.

For the resonator type filters, there has been the problem that when the above-mentioned receiving filter is designed, even if this filter satisfies performance requirements as a filter chip, housing the filter in a compact package and then connecting this package to an external circuit via high-resistance connection means deteriorates transmitting-band attenuation levels.

This tendency is likely to become a more serious problem in the intended passive/active devices that use SiP (System in Package), SoC (System on Chip), or other technologies whose practical use will progress in the future.

Problems associated with the deterioration of filter characteristics due to the miniaturization of a package will be described hereunder with reference to FIGS. 12 to 15.

FIG. 12 is a diagram showing an equivalent circuit of a resonator type filter based on conventional technology.

FIG. 13 is a view showing, for structural comparison, a large package and a small package.

FIG. 14 is a graph representing the frequency characteristics of a serial arm resonator and those of a parallel arm resonator.

FIG. 15 is a graph showing the differences in the deterioration of filter characteristics between the use of the large package and that of the small package.

As described above, the conventional technology has the problem that the miniaturization of the package increases the resistance of the means of connection to an external circuit and therefore deteriorates filter characteristics.

FIG. 12 shows the equivalent circuit of the resonator type filter described in Patent Reference 1, for example, and the resistance components of connection means 3 to an external circuit are explicitly shown.

In this resonator type filter, the parallel resonance frequency of a serial arm resonator 1 forms an attenuation region at a higher-frequency side than a pass band, whereas the serial resonance frequency of parallel serial arm resonator 2 forms an attenuation pole at the lower-frequency side of the pass band. FIG. 14 shows the frequency characteristics of the imaginary parts of the impedances in a serial arm resonator and a parallel arm resonator. The imaginary parts of the impedances become zero at serial resonance frequencies, as shown in FIG. 14. However, since the impedance element of the parallel arm resonator and that of connection means 3 are connected in series, even when the imaginary part of the impedance in the resonator becomes zero, the real part of impedance due to the resistance of the connection means will remain at serial resonance frequencies. Since, as described earlier herein, the serial resonance frequency of the parallel serial arm resonator forms an attenuation region at the lower-frequency side of the pass band, as the residual resistance components are augmented, attenuation levels in the attenuation band will deteriorate more significantly from an ideal state.

FIG. 13 schematically represents the relationship between the sizes of filter chip storage packages, external connection terminals (input/output terminals S and grounding terminals G), and VIA holes V. In comparison between the larger package shown in FIG. 13A and the smaller package shown in FIG. 13B, the number of grounding terminals G associated with the input/output terminals S is reduced from six in the large package to four in the smaller package due to the physical restrictions in manufacture. In addition, the number of VIA holes V is reduced from seven to four. At the same time, this makes it absolutely necessary to reduce the diameter of the VIA holes V as well.

In electrical terms, these changes due to dimensional reduction of the packages have a connection with the fact that the resistance components 3 of the connection means shown in FIG. 12 increase in an equivalent fashion. Increases in the resistance components existing between the parallel arm resonator and a grounding potential deteriorate the attenuation levels at the lower-frequency side, so the deterioration of filter characteristics due to the miniaturization of the package appears as shown in FIG. 15, with a solid line in the case of the larger package and with a broken line in the case of the smaller package.

As can be seen from these facts, in the configurations of resonator type filters based on the conventional techniques, the deterioration of filter characteristics due to increases in the resistance of connection means is unavoidable and as the packaging density increases, the deterioration of attenuation levels at the lower-frequency side of the filters becomes more intensified.

Neither above-mentioned Patent Reference 2 nor above-mentioned Patent Reference 6 discloses improving the deterioration of characteristics in lower-frequency band attenuation levels due to dimensional reduction of the respective packages.

The present invention proposes a method of improving such deterioration of attenuation levels in an attenuation band, caused by increases in a resistance value of connection means due to mounting in a package, and the invention is widely applicable to resonator type filters that use resonators such as a surface acoustic wave resonator and an FBAR which utilizes longitudinal vibration.

In a resonator type filter of the present invention, the deterioration of attenuation levels in an attenuation band, caused by increases in a resistance value of connection means due to mounting in a package, is improved by adding an attenuation-band attenuation-improving resonator in parallel to at least one serial arm resonator by use of a technique which uses the serial arm resonator and parallel arm resonator described in Patent Reference 1. When a serial resonance frequency of the resonator added in parallel to a serial arm is set to substantially the same value as a serial resonance frequency of the parallel arm resonator, since the two resonators will act on each other to generate a resultant admittance value of the serial arm having the two resonators connected in parallel thereto, not only a frequency at which the admittance that existed before one resonator was added becomes zero will occur, but also will a second frequency occur that makes the admittance equal to zero. The occurrence of two frequencies at which the admittance becomes zero in the composite circuit of the serial arm indicates that two attenuation poles are generated by the serial-arm resonator structure (i.e., parallel connection of the two resonators). As described in Patent Reference 1, in the resonator type filter, a pass-band higher-frequency attenuation region is formed at the parallel resonance frequency of the serial arm resonator at the admittance of zero, and a pass-band lower-frequency attenuation region is formed at the serial resonance frequency of the parallel arm resonator at the impedance of zero. The second frequency of admittance=0, generated by the resonator added to the serial arm, occurs in vicinity of the serial resonance frequency of the parallel arm resonator at the impedance of zero. This means that the second attenuation pole generated by the serial arm is generated in the lower-frequency attenuation region of the pass band. Since this second attenuation pole is generated from the serial arm resonator, this resonator is not affected by increases in the resistance of the connection means to an external circuit due to dimensional reduction of the package, as discussed in the description of the problems to be solved by the present invention.

As described above, the resonator type filter of the present invention can improve attenuation levels in a lower-frequency attenuation band by utilizing a function of the serial arm resonator not affected by the connection means leading to an external circuit. Thus, necessary attenuation characteristics can be achieved in a compact package, even when the filter adopts a next-generation form of mounting, such as SiP or SoC.

The present invention can improve such deterioration of attenuation levels in an attenuation band, caused by increases in a resistance value of connection means due to mounting in a package, and the invention is widely applicable to resonator type filters that use resonators such as a surface acoustic wave resonator and an FBAR which utilizes longitudinal vibration.

DETAILED DESCRIPTION OF THE PREFERRED EMBODIMENTS

Embodiments of the present invention will be described hereunder with reference to FIGS. 1 to 11.

First Embodiment

A first embodiment of the present invention is described below with reference to FIGS. 1 to 6.

The present invention connects an additional resonator in parallel to at least one serial arm resonator in order to improve deterioration of filter characteristics due to an increase in a resistance value of a connection element with an increase in packaging density. The fact that an attenuation level at a lower-frequency side can be improved by adding a parallel resonator to the serial arm resonator is described in detail using the graphs that represent more specific frequency characteristics.

Figure 1:
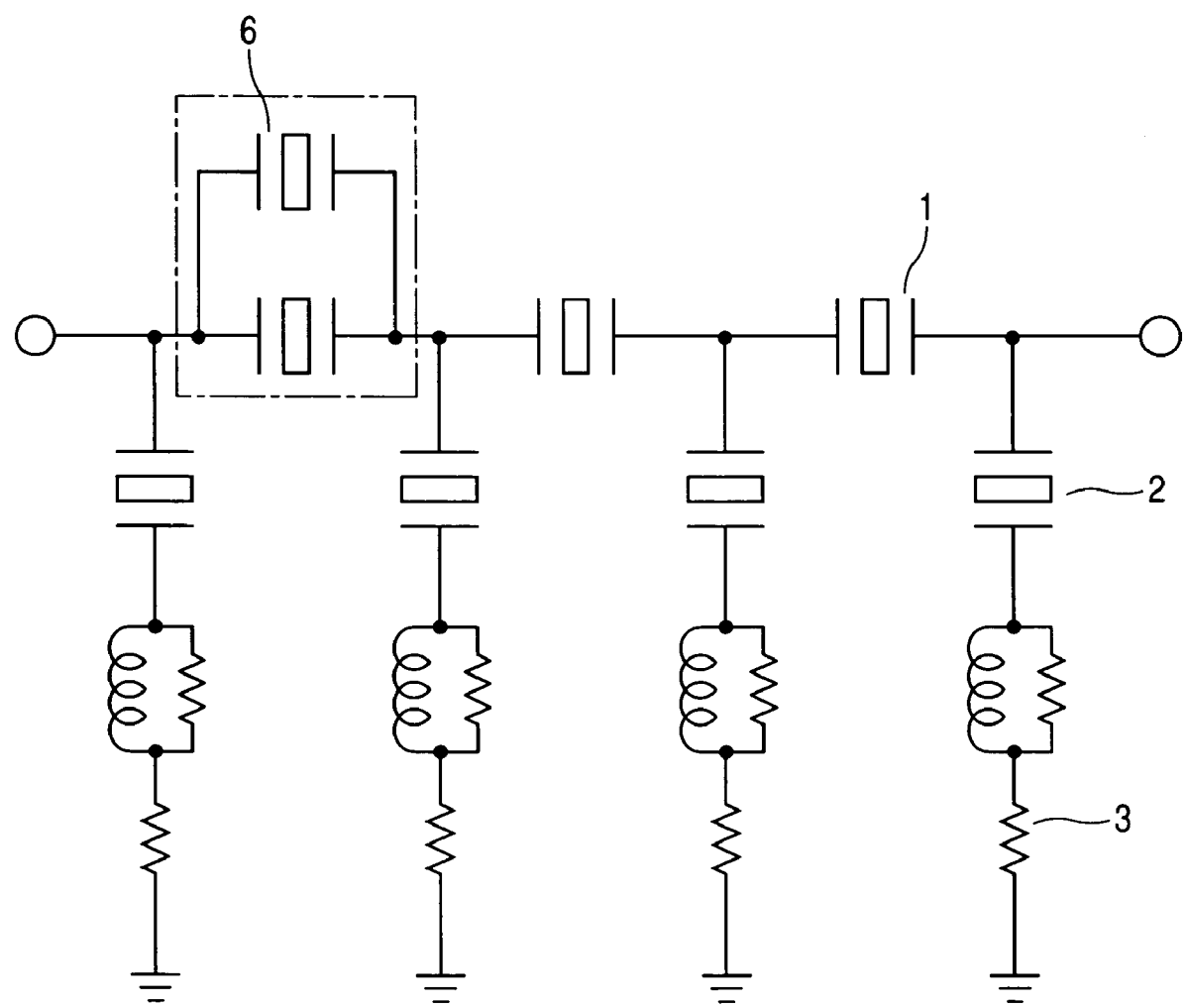
FIG. 1 is a diagram showing an equivalent circuit of a resonator type filter according to the present invention.

FIG. 1 is a diagram showing an equivalent circuit of a resonator type filter according to the present invention.

Figure 2:
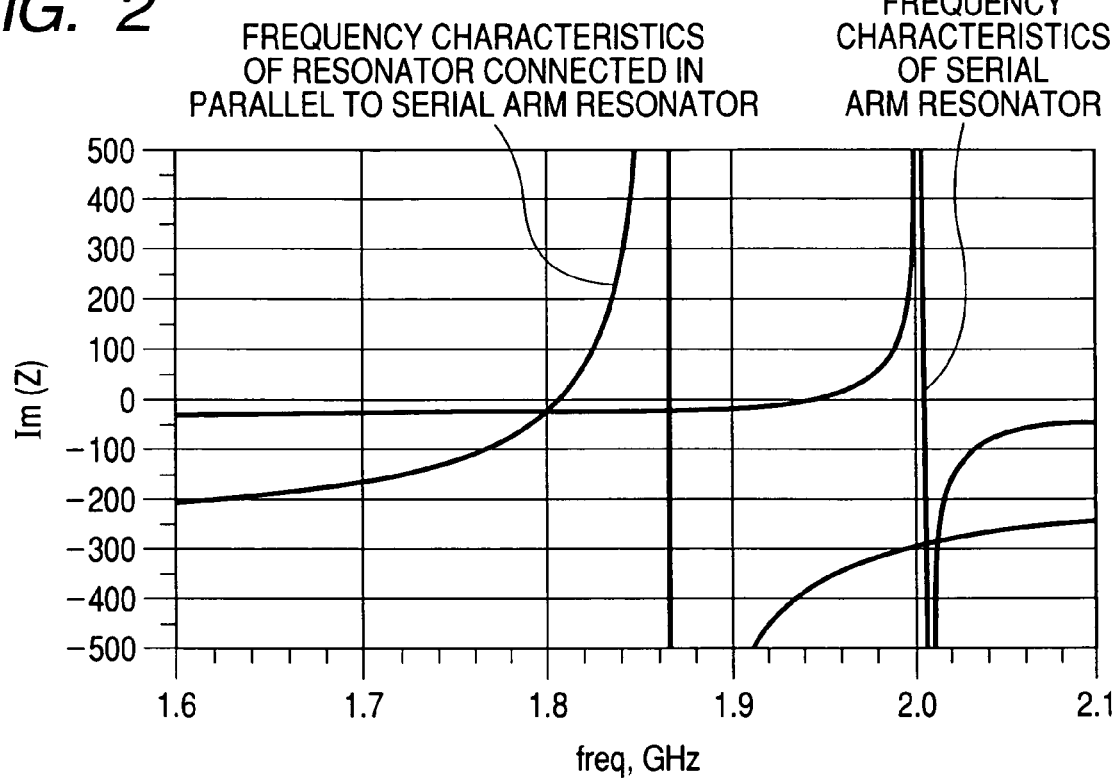
FIG. 2 is a graph that represents frequency characteristics of an imaginary part of impedance in a serial arm resonator which forms the resonator type filter according to the present invention.

FIG. 2 is a graph that represents frequency characteristics of an imaginary part of impedance in a serial arm resonator which forms the resonator type filter according to the present invention.

Figure 3:
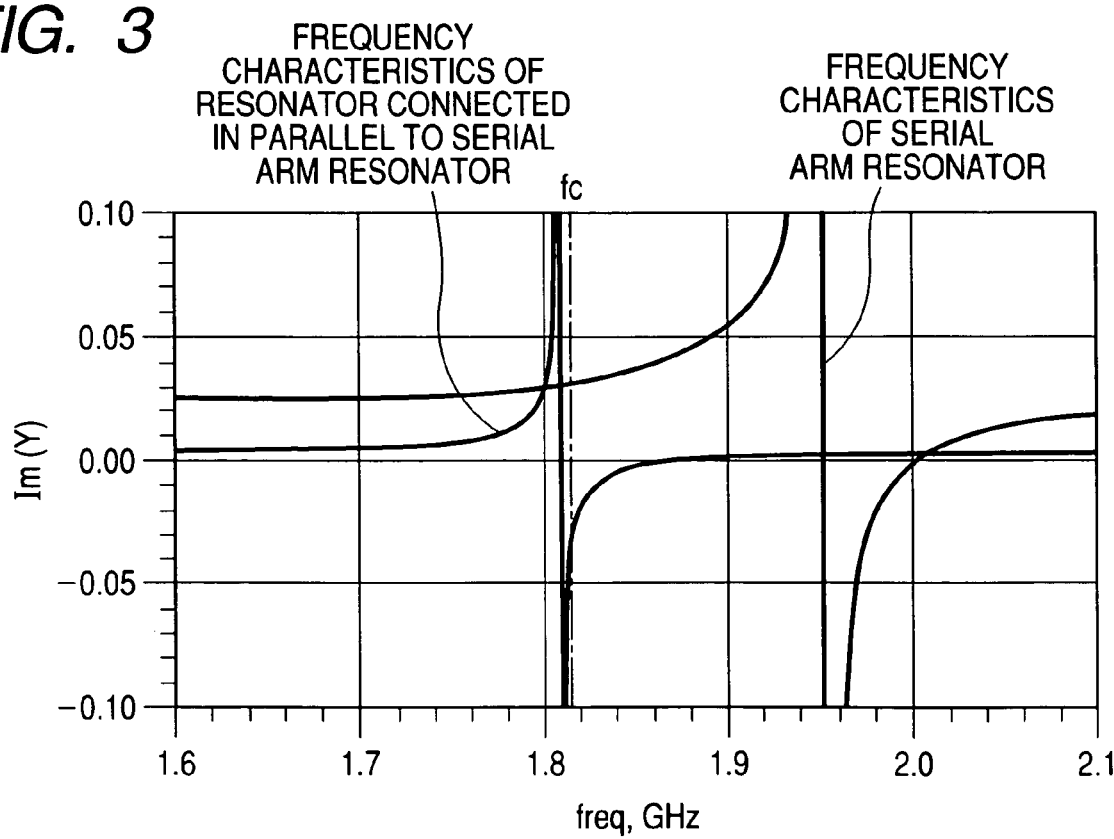
FIG. 3 is a graph that represents frequency characteristics of admittance in the serial arm resonator forming the resonator type filter according to the present invention.

FIG. 3 is a graph that represents frequency characteristics of admittance in the serial arm resonator forming the resonator type filter according to the present invention.

Figure 4:
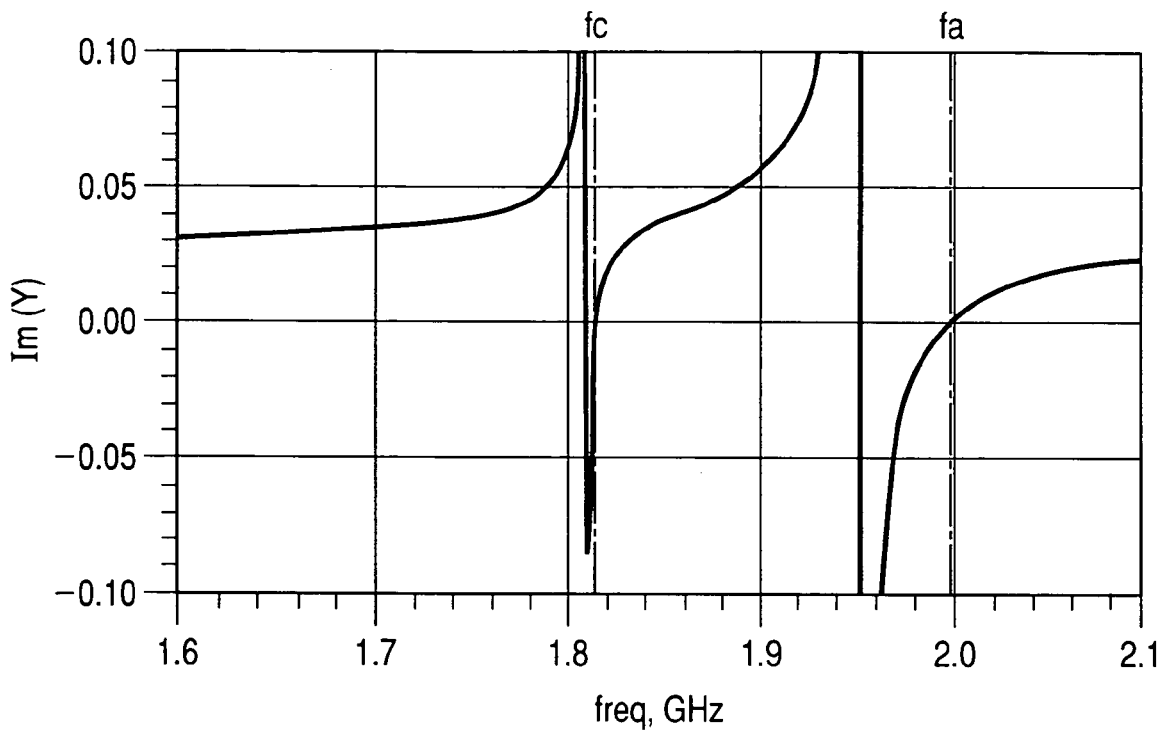
FIG. 4 is a graph that represents frequency characteristics of resultant admittance in the serial arm resonator forming the resonator type filter according to the present invention.

FIG. 4 is a graph that represents frequency characteristics of resultant admittance in the serial arm resonator forming the resonator type filter according to the present invention.

Figure 5:
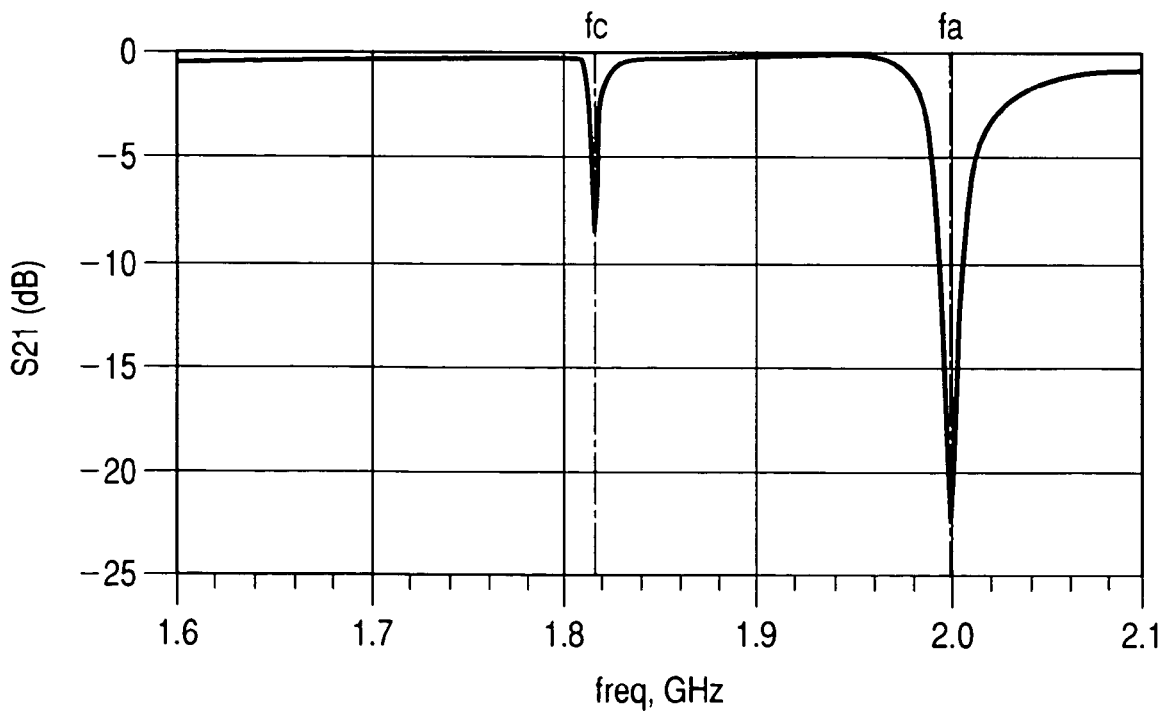
FIG. 5 is a graph that represents pass characteristics of the serial arm resonator forming the resonator type filter according to the present invention.

FIG. 5 is a graph that represents pass characteristics of the serial arm resonator forming the resonator type filter according to the present invention.

Figure 6:
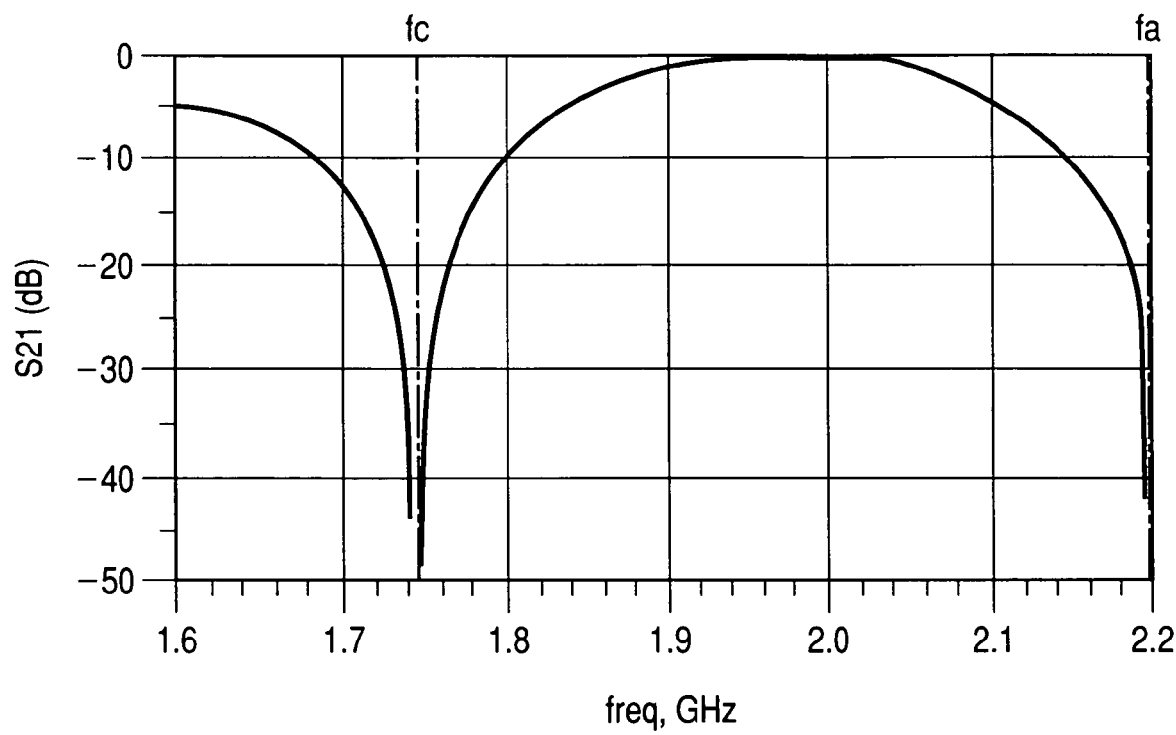
FIG. 6 is a graph that represents the pass characteristics obtained when an inductance element is connected in parallel to the serial arm resonator.

FIG. 6 is a graph that represents the pass characteristics obtained when an inductance element is connected in parallel to the serial arm resonator.

Figure 7:
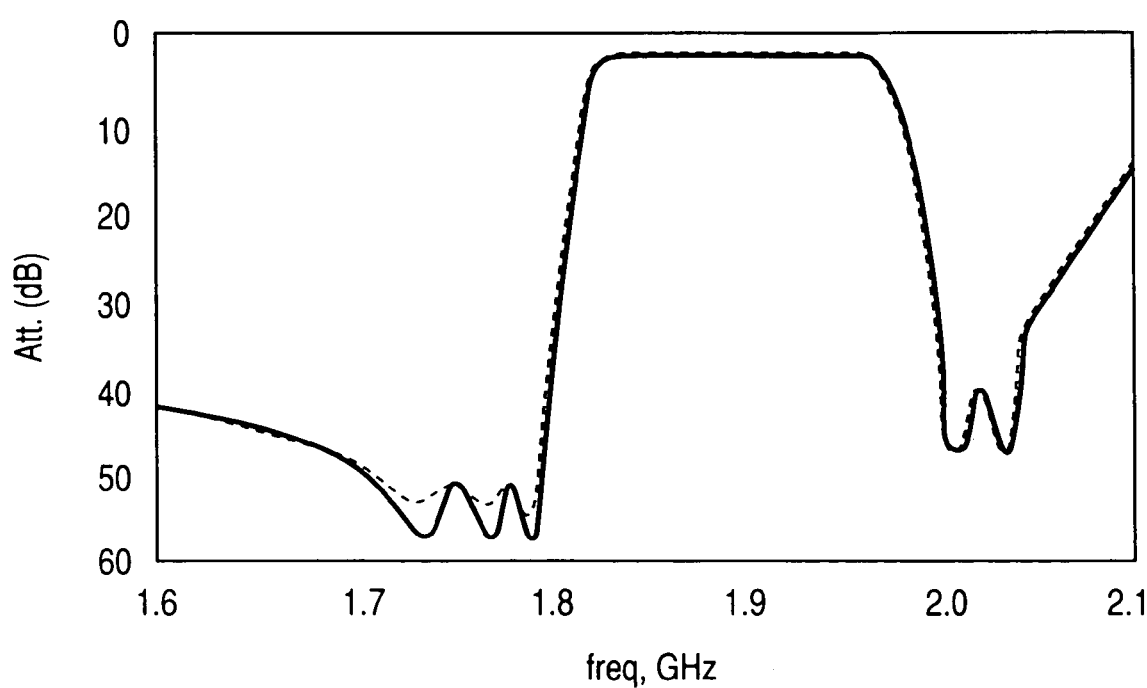
FIG. 7 is a graph showing an example of improved frequency characteristics in the resonator type filter according to the present invention.
Figure 8A:
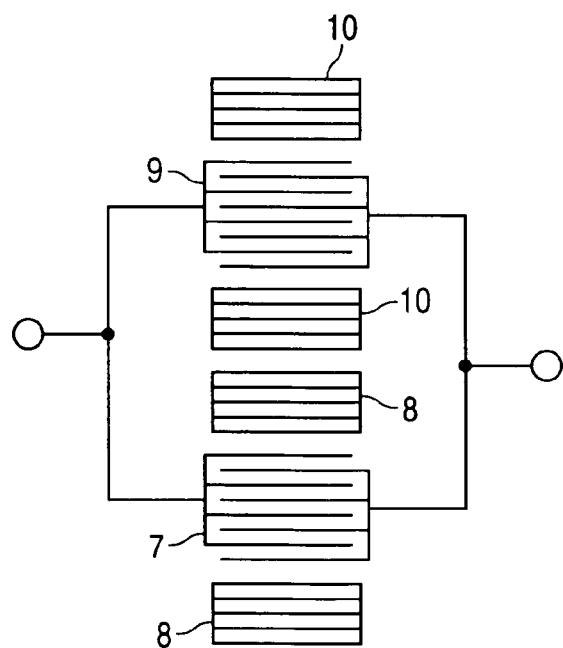
FIG. 8 is a diagram showing an example of patterns in a surface acoustic wave resonator.
Figure 8B:
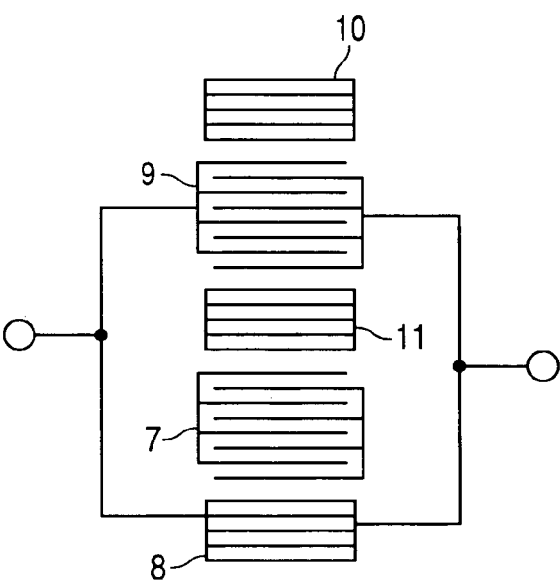

FIG. 7 is a graph showing an example of improved frequency characteristics in the resonator type filter according to the present invention.

Figure 12:
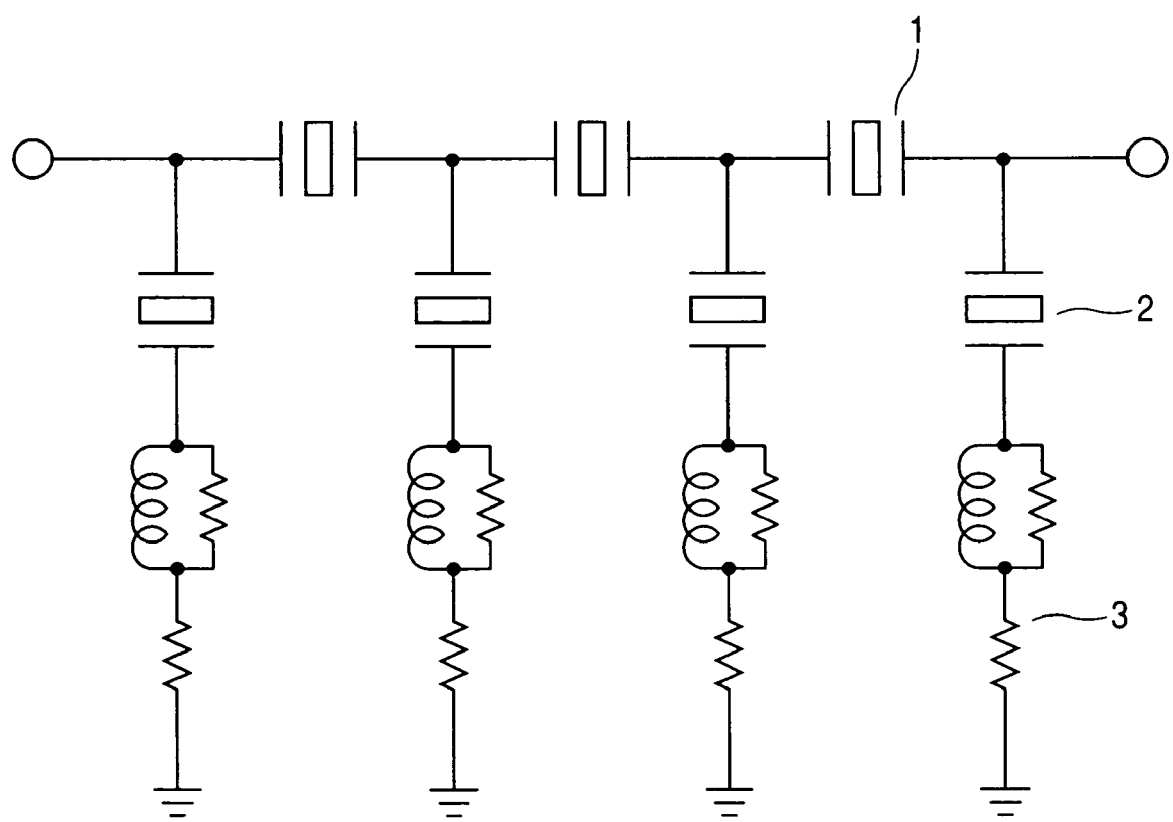
FIG. 12 is a diagram showing the equivalent circuit of a resonator type filter based on conventional technology.

The example shown in FIG. 1 relates to an equivalent circuit composed by connecting a resonator in parallel to one of the serial arm resonators constituting the resonator type filter based on conventional technology. As shown in FIG. 1, a resonator 6 is connected in parallel to a serial arm resonator 1 and a resonator 2 is connected to a parallel arm and grounded via a resistor 3 formed by a connection element leading to an external circuit. In order to explain advantageous effects of the two parallel-connected resonators boxed with a broken line in FIG. 1, FIG. 2 graphically shows frequency characteristics of impedance in the resonators. The serial arm resonator has the same frequency characteristics as those shown in FIGS. 10 and 12. As is obvious from the impedance characteristics of the resonator connected in parallel to the serial arm resonator, FIG. 2 assumes that a serial resonance frequency of the resonator connected in parallel is set to be substantially the same value as that of the parallel-arm-connected resonator shown in FIG. 12.

Since the resonators 6 and 1 act on each other, admittance of the composite circuit consisting of the resonators and 1 becomes zero, that is, an attenuation pole is generated, at a frequency of "fc" slightly higher than the resonance frequency of the resonator 6. In the present invention, the frequency of "fc" is set to be near the serial resonance frequency of the parallel arm resonator to thereby improve attenuation characteristics.

It is desirable, therefore, that resonance frequencies of the resonators 6 and 2 in FIG. 1 should agree within an attenuation-band frequency width range (e.g., for a PCS system, 60 MHz). If this condition is satisfied, it is obvious that the attenuation band characteristics formed at the serial resonance frequency of the parallel arm resonator are improved by the addition of the resonator 6.

To understand the operation of the circuit constituted by the two resonators boxed with a broken line in FIG. 1, it is necessary to calculate admittance of the composite circuit. FIG. 3 shows calculation results on respective admittance characteristics of the two resonators, based on the frequency characteristics of impedance in FIG. 2. As can be seen from FIG. 3, positive components and negative components of respective admittances of the resonators become equal at the frequency "fc" shown with a dashed line. Since the admittance of the composite circuit can be calculated as a sum of the admittances of the resonators, the admittance of the composite circuit becomes zero at "fc". Calculation results on actual resultant admittance are shown in FIG. 4.

FIG. 4 indicates that a frequency at which the admittance becomes zero is newly generated as "fc" in addition to the frequency of "fa" that has been used to form an attenuation region at the higher-frequency side of the pass band in the resonator type filter of the conventional technology as well. Such characteristics as in FIG. 5 can be obtained by calculating, from the admittance characteristics in FIG. 4, pass characteristics of the serial arm circuit constituted by the two resonators boxed with a broken line in FIG. 1. The pass characteristics in FIG. 5 indicate that connecting a resonator in parallel to a serial arm resonator makes it possible to form an attenuation pole not only at the higher-frequency side of the pass band, but also at the lower-frequency side of the pass band, from the circuit of the serial arm. Since the two attenuation poles are both due to a serial-arm resonator structure (i.e., parallel connection of the two resonators), the formation of these attenuation poles does not have a relationship with resistance enhancement of the connection element 3 shown in the equivalent circuit of the resonator type filter. This enables the formation of a lower-frequency attenuation band which does not deteriorate, even in a high-density-packaged device.

As described above, the formation of a new attenuation pole by parallel connection of a serial arm resonator is a phenomenon peculiar to a parallel-connected resonator arrangement. Parallel connection of a capacitive element as described in Patent References 2 and 3, therefore, only varies the intervals between the serial resonance frequency and parallel resonance frequency of an existing serial arm resonator and does not form a new attenuation pole. In addition, parallel connection of an inductance element as described in Patent Reference 4 can generate a new zero point, but monotonous frequency characteristics of the inductance element necessarily cause the pass characteristics of the composite circuit to appear as shown in FIG. 6.

As can be seen from FIG. 6, if such conditions are established that generate two attenuation poles with the parallel-connected inductance element, "fa" shifts more significantly towards the higher-frequency side than the original "fa" of the resonator. Consequently, the original sharp/steep characteristics of the resonator degrades and there is no practical meaning.

As described above, since an attenuation pole due to the serial arm is formed, connecting the resonator 6 in parallel to the serial arm resonator 1 (as in FIG. 1) makes it possible to strengthen (as shown with a solid line in FIG. 7) the pass-band lower-frequency attenuation band (shown with a broken line in FIG. 7) that has been deteriorated by the increase in the resistance of the connection means leading to an external circuit.

Second Embodiment

A second embodiment of the present invention is described below with reference to FIG. 8.

FIG. 8 is a diagram showing an example of patterns in a surface acoustic wave resonator.

The present embodiment applies to a specific example of connecting two resonators in parallel in a surface acoustic wave resonator. In this surface acoustic wave resonator, a serial arm resonator can be connected in parallel to a resonator formed up of an interdigital transducer (IDT) 7 and a reflector 8, by disposing, as in FIG. 8A, a reflector formed up of an IDT 9 and a reflector 10. Also, the reflectors disposed between the IDTs 7 and 9 are integrally formed as in FIG. 8B to provide a reflector 11, thereby making it possible to minimize an increase in chip area due to the resonator connected in parallel to the serial arm resonator.

Third Embodiment

A third embodiment of the present invention is described below with reference to FIG. 9.

Figure 9:
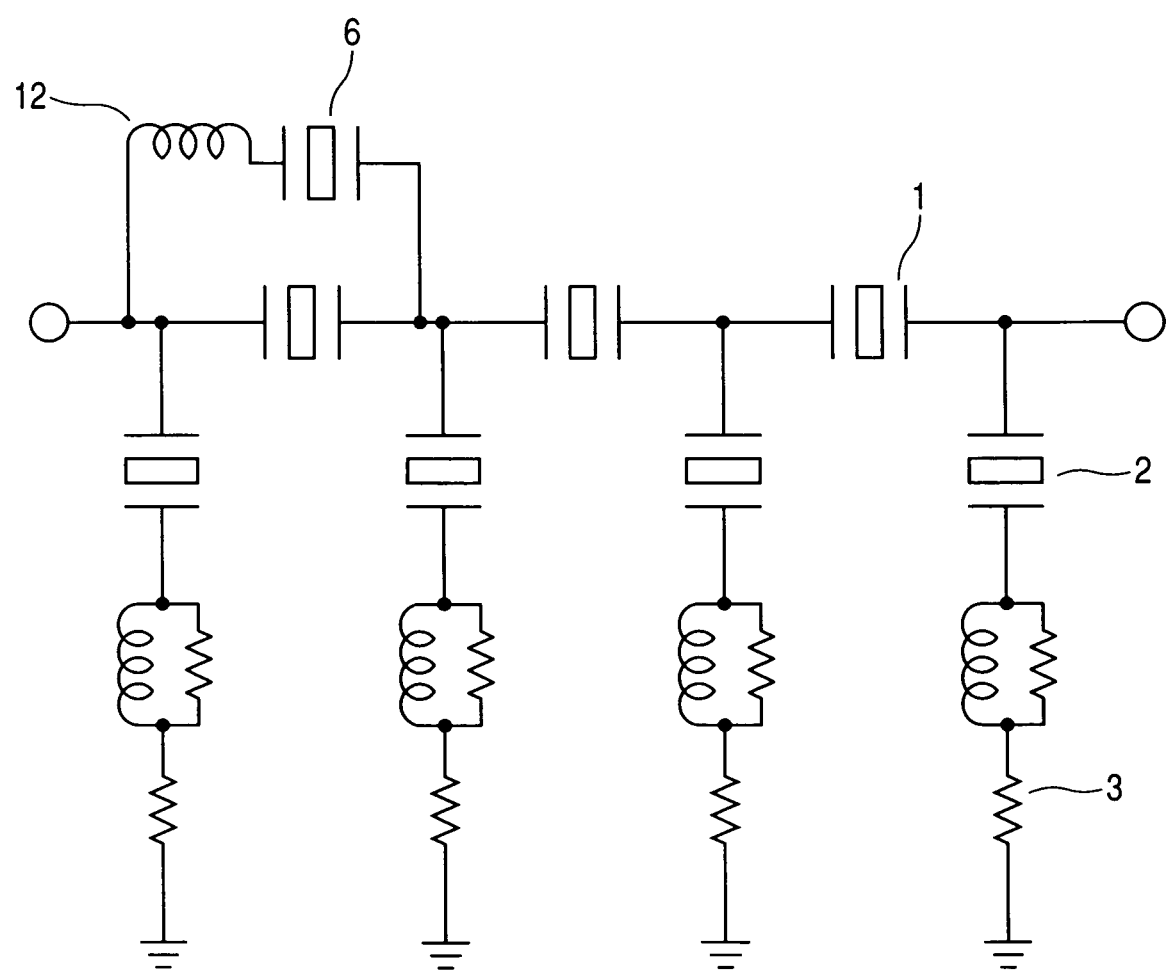
FIG. 9 is a diagram showing an equivalent circuit with an inductance element further added in series to a resonator 6 of a serial arm added in parallel.

FIG. 9 is a diagram showing an equivalent circuit with an inductance element further added in series to a resonator 6 of a serial arm added in parallel.

The present embodiment applies to a specific example of applying a configuration of the present invention to a BAW (Bulk Acoustic Wave Resonator) resonator such as an FBAR (Filmed Bulk Acoustic Wave Resonator) or SMR (Solidly Mounted Resonator).

Figure 13A:
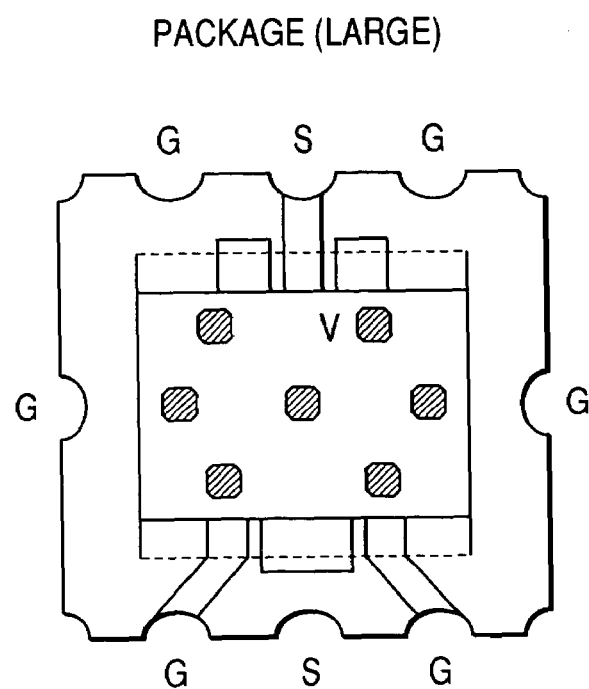
FIG. 13 is a view showing, for structural comparison, a large package and a small package.
Figure 13B:
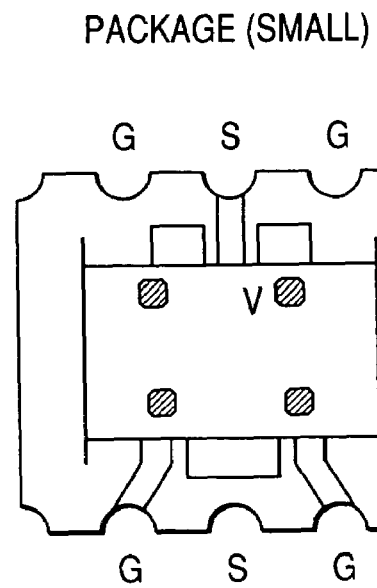
Figure 14:
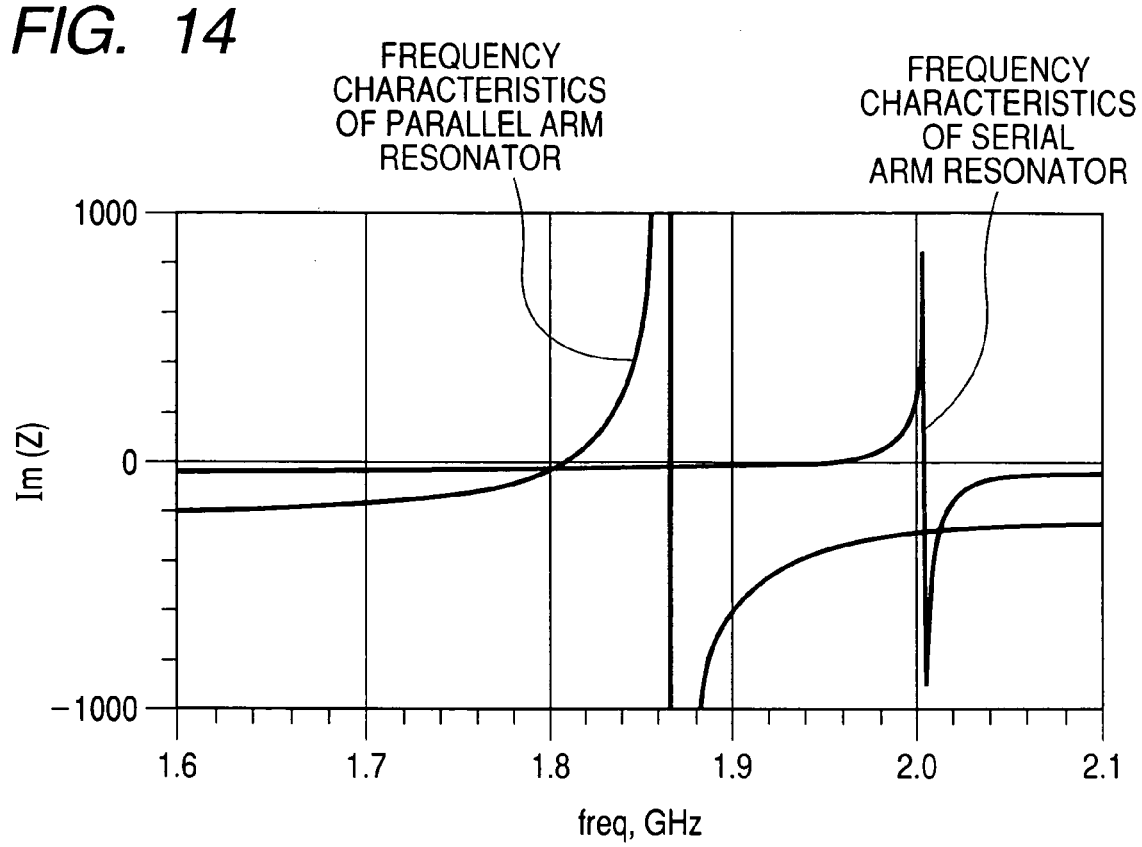
FIG. 14 is a graph representing the frequency characteristics of a serial arm resonator and those of a parallel arm resonator.
Figure 15:
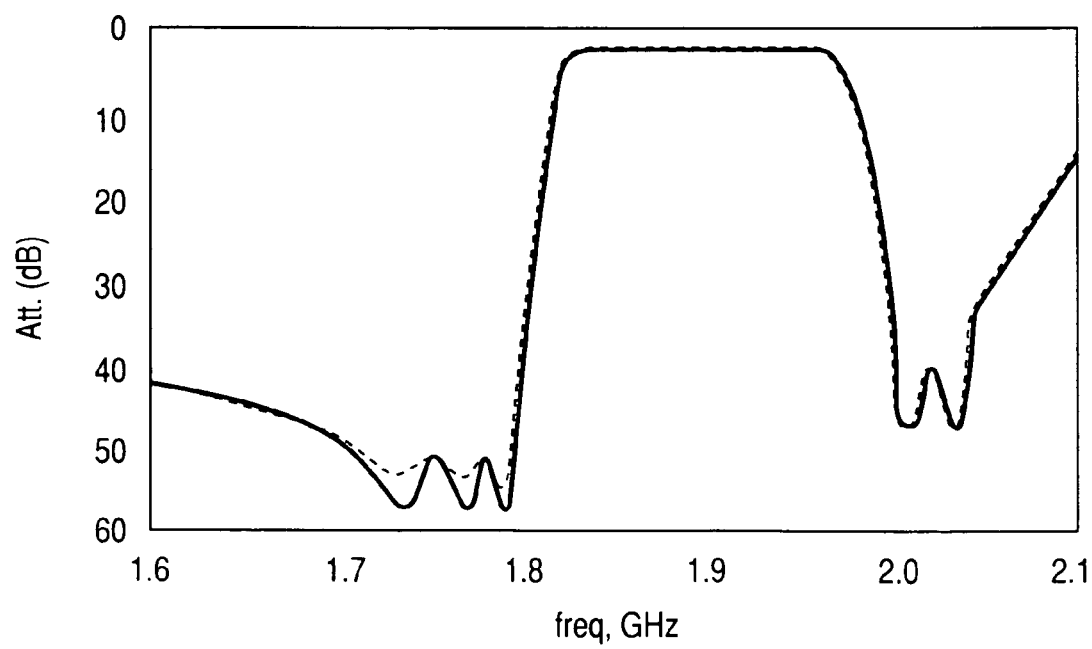
FIG. 15 is a graph showing the differences in the deterioration of filter characteristics between the use of the large package and that of the small package.

Although resonance frequencies of a surface acoustic wave resonator can be arbitrarily set at basic periods of IDTs, resonance frequencies of a BAW resonator needs to be controlled by adjusting a thickness of a piezoelectric thin film, so if too much flexibility of resonance frequency setting is sought, this will increase the number of man-hours in a manufacturing process, thus resulting in increased costs. The present embodiment proposes a method of solving this problem. It has already been described that if substantially the same resonance frequency as that of a parallel arm resonator is set for the resonator connected in parallel to a serial arm resonator, the attenuation levels at the lower-frequency side of a pass band can be improved. In terms of design, however, there may desirably be the flexibility of resonance frequency setting. In that case, as shown in FIG. 13, connecting an inductance element 12 in series to the resonator 6 connected in parallel to the serial arm makes it possible to precisely adjust a frequency of the attenuation pole generated by addition of resonator 6. Design flexibility can thus be improved without increasing the number of kinds of film thicknesses needed to achieve filter characteristics.

Fourth Embodiment

A fourth embodiment of the present invention is described below with reference to FIG. 10.

Figure 10:
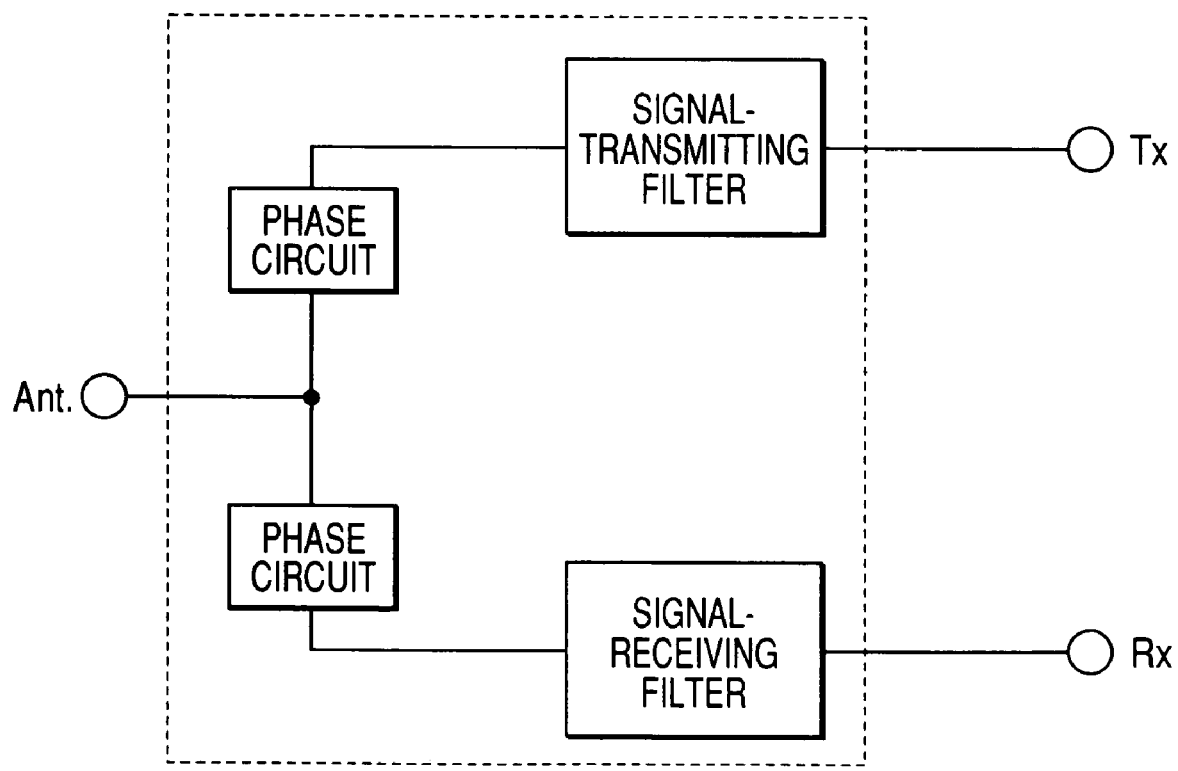
FIG. 10 is a configuration diagram of a branching filter which uses the resonator type filter according to the present invention.

FIG. 10 is a configuration diagram of a branching filter which uses the resonator type filter of the present invention.

As described above, according to the configuration of the present invention, it is possible to realize high-frequency filters improved in the deterioration of performance due to dimensionally reduced packaging, encountered in the conventional technology. Applying these high-frequency filters to, for example, a branching filter formed up of a signal-transmitting filter, a signal-receiving filter, and phase circuits, as shown in the configuration diagram of FIG. 10, enables a high-performance branching filter to be realized.

Fifth Embodiment

A fifth embodiment of the present invention is described below with reference to FIG. 10.

Figure 11:
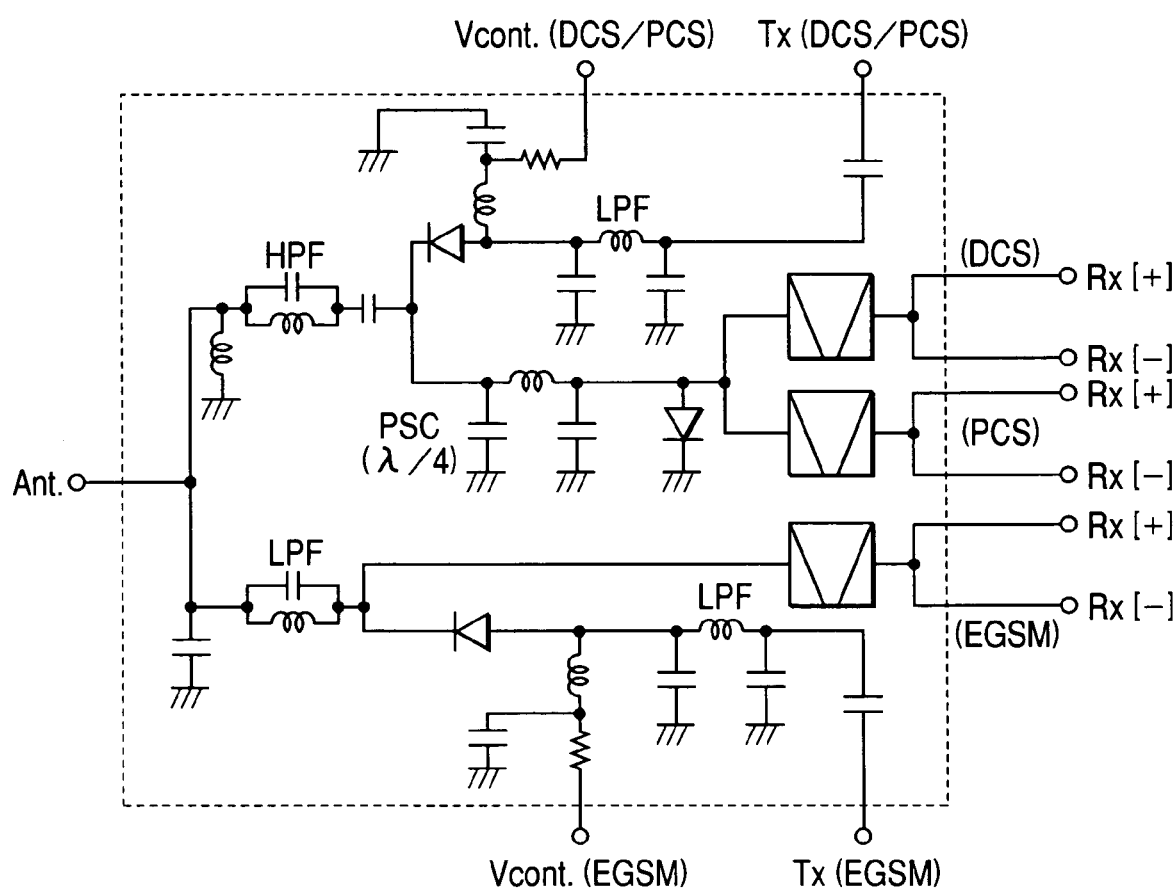
FIG. 11 is a configuration diagram of a front-end module which uses the resonator type filter according to the present invention.

FIG. 11 is a configuration diagram of a front-end module which uses the resonator type filter of the present invention.

A resonator-type high-frequency filter of the present invention can also be applied to a high-frequency front-end module (FEM) formed by, for example, combining such plural-band frequency signal receiving filters and switch circuits as shown in the configuration diagram of FIG. 11. The application of this filter becomes an element technology for realizing high-performance FEM.

The configuration of the present invention enables realization of resonator type filters capable of being mounted in compact size. A branching filter, a front-end module, an RF module, and a wireless system will improve in performance if the resonator type filters are built into each.

What is claimed is:

1. A resonator type filter comprising:
   a serial arm resonator unit; and
   a parallel arm resonator unit,
   wherein the serial arm resonator unit has two different resonators connected in parallel thereto, and
   wherein a resonance frequency of one of the two resonators forming the serial arm resonator unit is substantially equal to a resonance frequency of a resonator of the parallel arm resonator unit.

2. The resonator type filter according to claim 1, wherein bonding wire or VIA hole is used to connect the parallel arm resonator unit and a grounding potential.

3. The resonator type filter according to claim 1, wherein the resonator includes a surface acoustic wave element.

4. The resonator type filter according to claim 3, wherein reflectors of both the two resonators connected in parallel to the serial arm resonator unit are integrally formed.

5. The resonator type filter according to claim 1, wherein the resonator includes a BAW element.

6. The resonator type filter according to claim 4, wherein an inductance element is connected in series to one of the two resonators connected in parallel to the serial arm resonator unit.

7. A branching filter using a resonator type filter, said filter comprising:
   a serial arm resonator unit; and
   a parallel arm resonator unit,
   wherein the serial arm resonator unit has two different resonators connected in parallel thereto, and
   wherein a resonance frequency of one of the two resonators forming the serial arm resonator unit is substantially equal to a resonance frequency of a resonator of the parallel arm resonator unit.

8. A front-end module using a resonator type filter, said filter comprising:
   a serial arm resonator unit; and
   a parallel arm resonator unit,
   wherein the serial arm resonator unit has two different resonators connected in parallel thereto, and
   wherein a resonance frequency of one of the two resonators forming the serial arm resonator unit is substantially equal to a resonance frequency of a resonator of the parallel arm resonator unit.

* * * * *